(12) United States Patent
Endo

(10) Patent No.: US 9,893,114 B2
(45) Date of Patent: Feb. 13, 2018

(54) METHOD OF PRODUCING IMAGE PICK-UP APPARATUS AND IMAGE PICK-UP APPARATUS

(71) Applicant: CANON KABUSHIKI KAISHA, Tokyo (JP)

(72) Inventor: Nobuyuki Endo, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/579,595

(22) Filed: Dec. 22, 2014

(65) Prior Publication Data

US 2015/0214269 A1 Jul. 30, 2015

(30) Foreign Application Priority Data

Dec. 26, 2013 (JP) ................................. 2013-269672

(51) Int. Cl.
- *H01L 27/146* (2006.01)
- *H01L 21/02* (2006.01)
- *H01L 21/768* (2006.01)

(52) U.S. Cl.
CPC .... *H01L 27/14685* (2013.01); *H01L 21/0217* (2013.01); *H01L 21/02321* (2013.01); *H01L 21/76829* (2013.01); *H01L 21/76832* (2013.01); *H01L 27/1462* (2013.01); *H01L 27/1463* (2013.01); *H01L 27/14612* (2013.01); *H01L 27/14616* (2013.01); *H01L 27/14636* (2013.01); *H01L 27/14689* (2013.01)

(58) Field of Classification Search
CPC ......... H01L 27/14685; H01L 27/14689; H01L 27/14612; H01L 27/14636; H01L 27/14616
See application file for complete search history.

(56) References Cited

U.S. PATENT DOCUMENTS

| 7,993,951 | B2 * | 8/2011 | Okabe ............... H01L 21/28518 257/E31.052 |
| 2006/0115230 | A1 | 6/2006 | Komoguchi |
| 2010/0224917 | A1 | 9/2010 | Yamaguchi |
| 2013/0088626 | A1 * | 4/2013 | Shoyama .......... H01L 27/14627 348/300 |

(Continued)

FOREIGN PATENT DOCUMENTS

| JP | 2003-282855 A | 10/2003 |
| JP | 2006216615 A | 8/2006 |

(Continued)

*Primary Examiner* — Tom Thomas
*Assistant Examiner* — Vincent Wall
(74) *Attorney, Agent, or Firm* — Canon USA, Inc., IP Division

(57) ABSTRACT

The method comprises forming a first silicon nitride film covering a pixel circuit section by thermal CVD; forming an opening in the first silicon nitride film by removing a first portion of the first silicon nitride film while remaining a second portion of the first silicon nitride film; forming a second silicon nitride film covering the opening by plasma CVD; forming an insulating film covering the first silicon nitride film and the second silicon nitride film and covering a peripheral transistor in the peripheral circuit section; and forming a contact plug passing through the insulating film and being in contact with the peripheral transistor.

11 Claims, 7 Drawing Sheets

(56) References Cited

U.S. PATENT DOCUMENTS

| | | | | |
|---|---|---|---|---|
| 2015/0097238 A1* | 4/2015 | Zhang | ................ | H01L 29/6659 |
| | | | | 257/347 |
| 2015/0147843 A1* | 5/2015 | Onuki | ............... | H01L 27/14643 |
| | | | | 438/59 |
| 2015/0214269 A1* | 7/2015 | Endo | ................ | H01L 27/14685 |
| | | | | 257/443 |

FOREIGN PATENT DOCUMENTS

| JP | 2006-261355 A | 9/2006 |
|---|---|---|
| JP | 2008041726 A | 2/2008 |
| JP | 2013-012618 A | 1/2013 |
| JP | 2013021352 A | 1/2013 |
| JP | 2013084693 A | 5/2013 |

\* cited by examiner

METHOD OF PRODUCING IMAGE PICK-UP APPARATUS AND IMAGE PICK-UP APPARATUS

BACKGROUND OF THE INVENTION

Field of the Invention

The present invention relates to an image pick-up apparatus.

Description of the Related Art

In an image pick-up apparatus, a silicon nitride film is disposed on a photoelectric conversion element and protects the photoelectric conversion element and prevents reflection.

Japanese Patent Laid-Open No. 2008-041726 describes formation of a silicon nitride film in a photoelectric conversion region by plasma chemical vapor deposition (CVD).

Japanese Patent Laid-Open No. 2013-84693 describes formation of a silicon nitride film covering at least a part of a photoelectric conversion portion by low pressure CVD, and also describes the use of hexechlorodisilane as a source gas of the silicon nitride film in the low pressure CVD.

In the formation of a silicon nitride film near a photoelectric conversion element by plasma CVD as in Japanese Patent Laid-Open No. 2008-041726, there is a risk that the photoelectric conversion element receives plasma damage and that noise is caused by the plasma damage.

The silicon nitride film formed by low pressure CVD as in Japanese Patent Laid-Open No. 2013-84693 has a low hydrogen permeability. Such a case has a risk of preventing the hydrogen supply from above the silicon nitride film in the step for termination with hydrogen, which is performed later, resulting in insufficient reduction of noise.

The technology of the present invention reduces noise in an image pick-up apparatus.

SUMMARY OF THE INVENTION

A first aspect of this disclosure is a method of producing an image pick-up apparatus, the image pick-up apparatus comprising a pixel circuit section including an array of pixel circuits each including a photoelectric conversion element and a pixel transistor generating a signal based on a charge generated in the photoelectric conversion element or resetting the generated charge; and a peripheral circuit section including peripheral transistor disposed in the periphery of the pixel circuit section. The method comprises forming a first silicon nitride film covering the pixel circuit section by thermal CVD; forming opening in the first silicon nitride film by removing a first portion of the first silicon nitride film, the first portion covering the semiconductor region in the pixel circuit section while remaining a second portion of the first silicon nitride film, the second portion covering the photoelectric conversion element and a channel part of the pixel transistor; forming a second silicon nitride film covering the opening by plasma CVD; forming an insulating film covering the first silicon nitride film and the second silicon nitride film in the pixel circuit section and covering the peripheral transistor in the peripheral circuit section; and forming contact plug passing through the insulating film and being in contact with the respective peripheral transistor.

A second aspect of the disclosure is an image pick-up apparatus comprising a pixel circuit section including an array of pixel circuits and a peripheral circuit section including peripheral transistor disposed in the periphery of the pixel circuit section. The apparatus includes a silicon nitride film covering the photoelectric conversion element in the pixel circuit section, a silicon nitride member covering the semiconductor region in the pixel circuit section, an insulating film covering the silicon nitride film and the silicon nitride member in the pixel circuit section and covering the peripheral transistor, and contact plug passing through the insulating film and being in contact with the respective peripheral transistors. The silicon nitride film is provided with opening between the silicon nitride member and the semiconductor region. At least one of the hydrogen concentration and the hydrogen permeability of the silicon nitride member is higher than that of the silicon nitride film.

Further features of the present invention will become apparent from the following description of exemplary embodiments with reference to attached drawings.

DESCRIPTION OF THE EMBODIMENTS

Figure 1A:
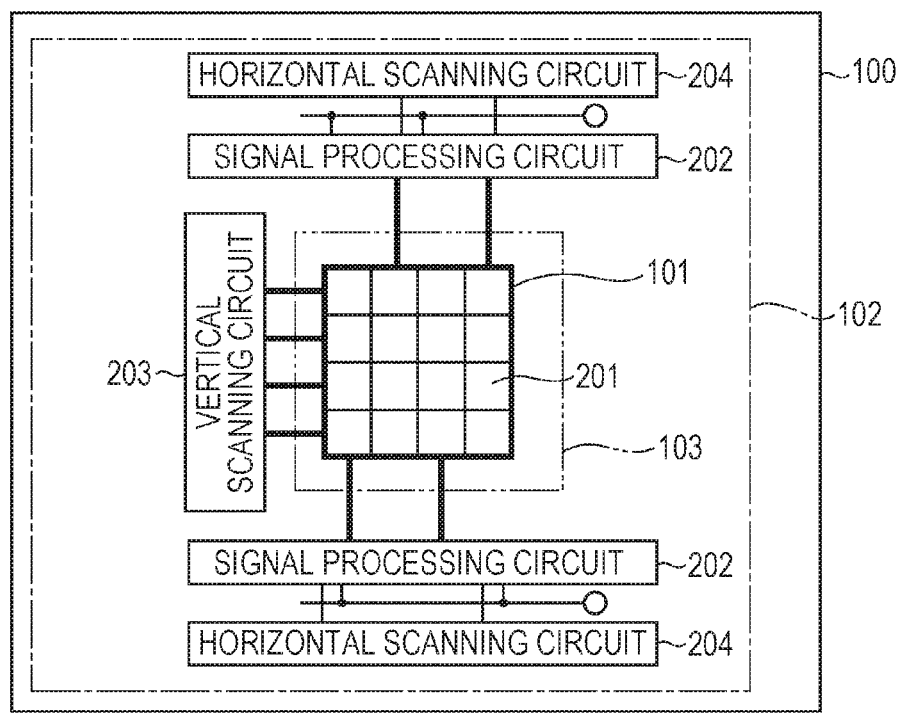
FIGS. 1A and 1B are schematic planar views of an image pick-up apparatus.

Embodiments of the present invention will now be described in detail by examples with reference to the drawings. The present invention is not limited to the following examples, and combinations and modifications within the gist of the invention are possible. In the following description and the drawings, the compositions that are common to multiple drawings are denoted with the same reference numerals. Accordingly, the common compositions will be described with reference to multiple drawings, and the descriptions of compositions denoted with the same reference numerals are appropriately omitted.

FIG. 1A shows an example of a schematic planar view of an image pick-up apparatus. The image pick-up apparatus 1 comprises a plurality of pixels each forming a part of an image. The pixel includes one or more photoelectric conversion elements. The pixel may further include a pixel optical system. In such a case, the photoelectric conversion element of the pixel corresponds to a single pixel optical system. A single pixel optical system includes, for example, one microlens in a microlens array and one color filter in a color filter array. In a case of a pixel not containing the pixel optical system, the pixel includes a single photoelectric conversion element.

The image pick-up apparatus 1 comprises a pixel circuit section 101 including an array of pixel circuits 201. The image pick-up apparatus 1 can further comprise a peripheral circuit section 102 including peripheral circuits (202 to 204). In FIG. 1A, the peripheral circuit section 101 is a region surrounded by the dashed line and the two-dot chain line. The peripheral circuit section 102 is disposed in the periphery of the pixel circuit section 101. The pixel circuit section 101 and the peripheral circuit section 102 are disposed on a single semiconductor substrate 100. In this example, an intermediate portion 103, which is the region surrounded by the two-dot chain line, is disposed between the pixel circuit section 101 and the peripheral circuit section 102. The intermediate portion 103 is not indispensable, and the pixel circuit section 101 and the peripheral circuit section 102 may be in contact with each other.

The pixel circuits 201 are each an electric circuit associated with a pixel and are each a minimum unit of the electric circuit in the pixel circuit section 101. The pixel circuit 201 includes the photoelectric conversion element of the pixel and also includes an element group for reading out a signal from the photoelectric conversion element of the pixel. The pixel circuit section 101 includes a plurality of pixel circuits 201 that are equivalent and are arrayed in a matrix form. The pixel circuits 201 each include an amplifying element and constitute a pixel amplification type image pick-up apparatus. In order to read out signals from the photoelectric conversion elements of different pixels, a structure in which at least any element in the element group of the pixel circuit 201 is shared by adjacent pixels can be employed. Focusing detection of a phase difference detection system can also be realized by disposing a plurality of photoelectric conversion elements in one pixel. In order to obtain a signal for focusing detection, signals from a plurality of photoelectric conversion elements in a pixel can be separately utilized. In order to obtain signals for forming an image, the sum of signals from a plurality of photoelectric conversion elements in a pixel can be utilized.

The peripheral circuit section 102 includes signal processing circuits 202, a vertical scanning circuit 203, and horizontal scanning circuits 204. The signal processing circuits 202 amplify signals read out from the pixel circuits 201 and remove noise from the signals by CDS processing. The vertical scanning circuit 203 is a driving circuit for selecting and driving a line of the pixel circuits 201 arrayed in the pixel circuit section 101. The horizontal scanning circuits 204 drive the corresponding signal processing circuits 202 and transfer signals from the signal processing circuits 202 to the outside. In the case of performing analog-digital conversion in the image pick-up apparatus 1, the peripheral circuit may include an analog-digital conversion circuit.

Figure 1B:
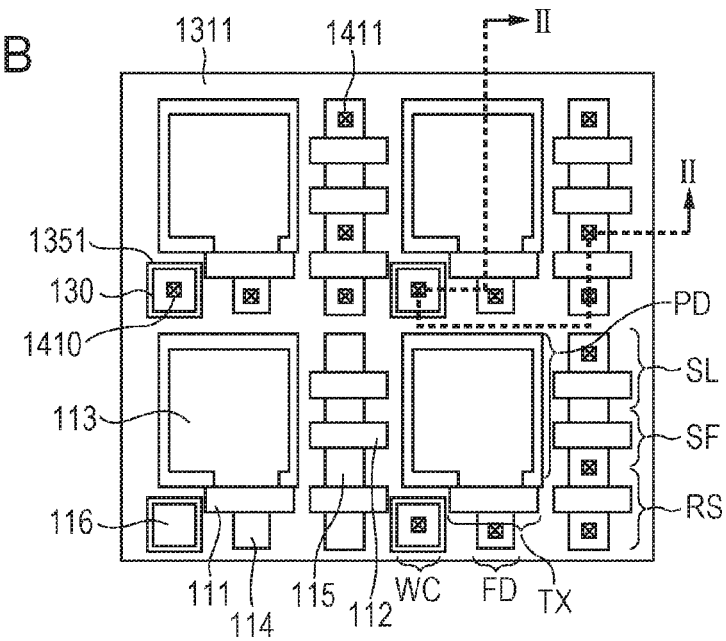

FIG. 1B shows an example of planar layout diagram of four pixel circuits 201 in the pixel circuit section 101 shown in FIG. 1A. Although the four pixel circuits are conveniently denoted with reference numerals from different viewpoints, the pixel circuits are equivalent. More details description of the elements in FIG. 1B will be discussed later in the description discussing of FIG. 2.

The pixel circuit 201 is composed of a photoelectric conversion element PD and an element group (TX, RS, SF, SL) including an element for reading out a signal from the photoelectric conversion element PD. The pixel circuit 201 includes a transfer element TX for transferring the charge generated in the photoelectric conversion element PD to a detection part FD; an amplifying element SF for generating a signal based on the amount of charge generated in the photoelectric conversion element PD; a reset element RS for resetting the charge generated in the photoelectric conversion element PD; and a selection element SL for selecting ON or OFF of a signal from the amplifying element SF.

In the pixel circuit 201 of this example, the photoelectric conversion element PD is a photodiode; the transfer element TX is a MOS gate; the detection part FD is composed of a floating diffusion region and wiring for electrically connecting the floating diffusion region and the amplifying element; and the reset element RS, the amplifying element SF, and selection element SL are MOS field effect transistors. Hereinafter, the MOS field effect transistor is referred to as metal-oxide-semiconductor field effect transistor (MOSFET). The MOSFET is synonymous with metal-insulator-semiconductor field effect transistor (MISFET), MOS transistor, or insulated gate field effect transistor. The gate insulating film is not limited to an oxide film and may be any type.

The transistors constituting the pixel circuit 201 are generally called pixel transistors. The type of the pixel transistor is not limited to the MOSFET and may be a junction field effect transistor (JFET) or a bipolar transistor. In addition, the pixel circuit 201 may include different types of transistors. In the description below, the reset element RS will be described as an example of the pixel transistor. Other pixel transistors of the pixel circuit 201 can also have the same structures as that of the reset element RS.

The drain of the amplifying element SF is supplied with a power source potential. The source of the amplifying element SF is connected to a current source via the selection element SL, and the amplifying element SF constitutes a source follower circuit. The detection part FD is connected to the source of the reset element RS. The detection part FD is also connected to the gate electrode 112 of the amplifying element SF. The source of the reset element RS is supplied with a reset potential, and the potentials of the gates of the detection part FD and the amplifying element SF are reset by turning on the gate of the reset element RS. The power source potential of the amplifying element SF may be used as the potential for pixel selection without using the selection element SL. Also, the power source potential may be used as the reset potential.

The pixel circuit section 101 includes a well contact part WC for supplying a potential (well potential) to the well of each element of the pixel circuit 201. The well contact part WC may be disposed for each pixel circuit 201. Alternatively, the pixel circuit section 101 may include a plurality of well contact parts WC such that one well contact part WC supplies a potential to a plurality of pixel circuits.

In this example, a first silicon nitride film 1311 covers the pixel circuit section 101 excluding the portion of the well contact part WC and the portion corresponding to the position of the contact plug 1411. In the pixel circuit section 101, a silicon nitride member 1351 covers the well contact part WC excluding the portion corresponding to the position of the contact plug 1410. In this embodiment, a relationship between the first silicon nitride film 1311 and the silicon nitride member 1351 is characteristic.

In the description below, the term "silicon nitride" refers to a compound of nitrogen and silicon having a Si—N bond. The silicon nitride may further contain at least one of hydrogen, carbon, oxygen, chlorine, and fluorine, and these elements other than nitrogen may bind to silicon.

Figure 2:
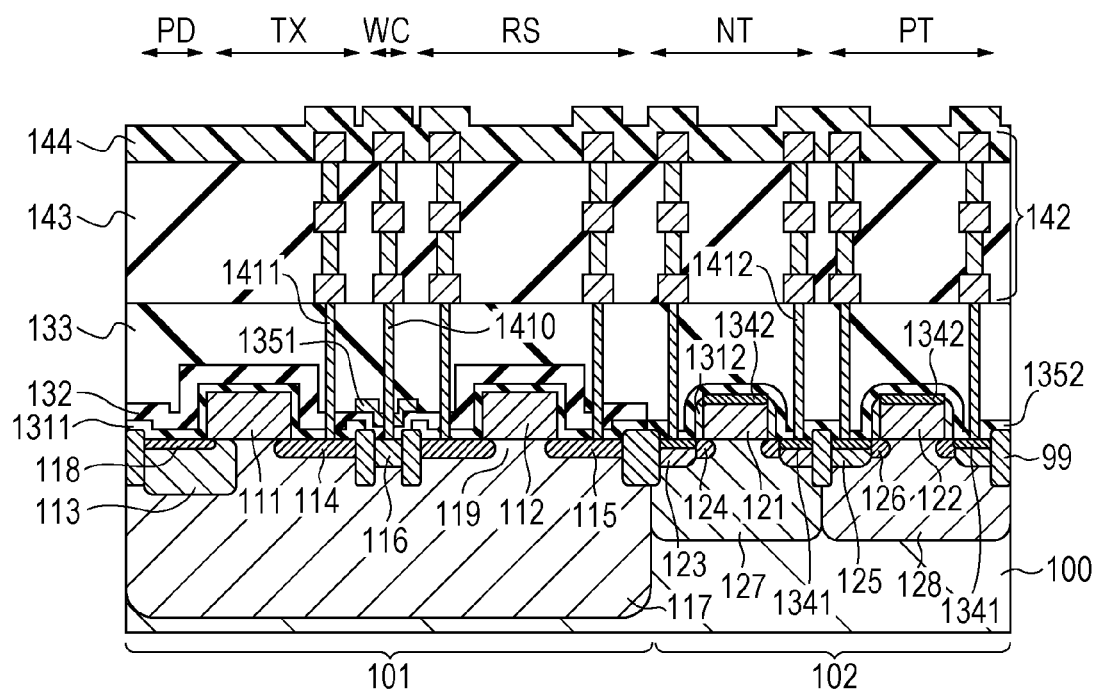
FIG. 2 is a schematic cross-sectional view of an image pick-up apparatus.

An image pick-up apparatus 1 according to the embodiment will now be described with reference to FIG. 2. FIG. 2 is a schematic cross-sectional view of a pixel circuit section 101 including a cross section along the II-II line in FIG. 1B.

FIG. 2 shows cross-sectional structures of the photoelectric conversion element PD, transfer element TX, detection part FD, and reset element RS in the pixel circuit section 101.

FIG. 2 is a schematic cross-sectional view including a cross section of the peripheral circuit section 102, wherein a plurality of transistors including a first conduction type MOS field effect transistor (nMOSFET) and a second conduction type MOS field effect transistor (pMOSFET) is shown. The transistors constituting the peripheral circuits are generally called peripheral transistors. In the peripheral circuit section 102, a first conduction type peripheral transistor (NT) and a second conduction type peripheral transistor (PT) may constitute a CMOS circuit. The peripheral circuit section 102 may include elements other than MOSFETs, such as resistance elements and capacitance elements.

An element-isolating insulator 99 formed by, for example, STI or selective oxidation (LOCOS) is disposed on a semiconductor substrate 100 such as a silicon substrate. The region provided with the element-isolating insulator 99 is the element isolation region, and the region other than the element isolation region is the active region. In the description below, the semiconductor region is a part or the whole of the active region. In the pixel circuit section 101, the gate electrode 111 of the transfer element TX and the gate electrode 112 of the reset element RS are disposed. The first conduction type semiconductor region 113 functions as a storage region of the photoelectric conversion element PD. The majority carrier of the first conduction type is photocharge (signal charge) that is treated by the photoelectric conversion element PD as a signal. When the signal charge is electrons, the conductivity is an N type. A second conduction type semiconductor region 118 is formed between the surface of the semiconductor substrate 100 and the semiconductor region 113 for forming the photoelectric conversion element PD with an embedded structure. The conduction of the second conduction type is opposite to that of the first conduction type. When the signal charge is electrons, the conductivity is a P type. A semiconductor region 114 of the first conduction type functions as a floating diffusion region of the detection part FD. A semiconductor region 115 of the first conduction type constitutes a source/drain part of the pixel transistor having a single drain structure. In the description below, the "source/drain part" is a portion where a terminal corresponding to a source and/or a drain is disposed. In some behavior of a transistor, a terminal of the transistor functions as a source in a period and functions as a drain in another period. The channel part described below is a portion generating a channel between a source and a drain and locating under the gate electrode.

The second conduction type semiconductor region 116 constituting at least a part of the well contact part WC is supplied with a potential for regulating the potential (well potential) of the second conduction type well 117. The well potential behaves as the reference potential of a pixel circuit. Though the reference potential is typically the ground potential, a bias may be applied by a potential other than the ground potential. The semiconductor region 116 is the same P type semiconductor region as that of the well 117 when electrons are used as the signal charge of the photoelectric conversion element PD. The semiconductor region 116 is surrounded by the element-isolating insulator 99 constituting an element isolation part, resulting in formation of an active region different from the active regions of the photoelectric conversion element PD and the amplifying element SF. Alternatively, the semiconductor region 116 may be disposed in the active region of the photoelectric conversion element PD or the amplifying element SF. A well contact part WC may be provided in each pixel circuit 201 or may be provided for a plurality of pixel circuits 201. The variation of well potentials of the pixel circuits 201 can be reduced by supplying of a well potential in the pixel circuit section 101, preventing occurrence of shading.

The pixel circuit section 101 is provided with a first silicon nitride film 1311 covering the photoelectric conversion element PD. The first silicon nitride film 1311 further covers the transfer element TX, the reset element RS, and the selection element SL. Specifically, the first silicon nitride film 1311 covers the upper surface of the gate electrode 111 of the transfer element TX, the side surfaces of the gate electrode 111, and the semiconductor region 114 (floating diffusion region) of the detection part FD. The channel part of the transfer element TX locates under the gate electrode 111 of the transfer element TX. Accordingly, the first silicon nitride film 1311 substantially covers the channel part of the transfer element TX. The first silicon nitride film 1311 covers the upper surface and the side surfaces of the gate electrode 112 of the amplifying element SF and the source/drain part of the reset element RS. Similarly, the first silicon nitride film 1311 covers the upper surface and the side surfaces of the gate electrode of the reset element RS and the source/drain part of the reset element RS. Furthermore, the first silicon nitride film 1311 covers the upper surface and the side surfaces of the gate electrode of selection element SL and the source/drain part of the selection element SL. The channel part 119 of the pixel transistor locates under the gate electrode of the pixel transistor. Accordingly, the first silicon nitride film 1311 substantially covers the channel part of the pixel transistor. That is, in the direction orthogonal to the principal surface of the semiconductor substrate 100, at least a part of the channel part 119 overlaps the first silicon nitride film 1311. The principal surface of the semiconductor substrate 100 is a face including the interface between the semiconductor substrate 100 and the gate insulating film. The first silicon nitride film 1311 is a continuous film that continuously covers a plurality of elements of the pixel circuit 201 and further continuously covers a plurality of photoelectric conversion elements PD in the pixel circuit section 101. That is, the first silicon nitride film 1311 can cover the semiconductor region (active region) between the photoelectric conversion elements PD of a plurality of pixels. In the active region between the photoelectric conversion elements PD, the source/drain part and the well contact part of each pixel circuit 201 are disposed.

A silicon oxide film (not shown) may be disposed between the first silicon nitride film 1311 covering the pixel circuit section 101 and the semiconductor substrate 100 or between the first silicon nitride film 1311 and the gate electrode 111, 112. The silicon oxide film may have a thickness smaller than that of the first silicon nitride film 1311. The silicon oxide film and the first silicon nitride film 1311 can jointly form an anti-reflection structure that can reduce the reflection of incident light on the surface of the photoelectric conversion element PD. That is, the term "silicon nitride" in this embodiment refers to not only a compound consisting of nitrogen and silicon but also a compound such as silicon oxynitride or silicon carbonitride. The first silicon nitride film 1311 has an opening 130 at the position above each semiconductor region 116.

The silicon nitride member 1351 covers the opening 130 (as shown in FIG. 1B). Covering the opening 130 by the silicon nitride member 1351 means that at least a part of the silicon nitride member 1351 overlaps the opening 130 in the direction orthogonal to the principal surface of the semiconductor substrate 100. Overlapping of the silicon nitride member 1351 and the opening 130 means that at least a part of the silicon nitride member 1351 does not overlap the first silicon nitride film 1311. Although the silicon nitride member 1351 covers the entire of the opening 130 in this example, the silicon nitride member 1351 may cover only a part of the opening 130. In addition, although at least a part of the silicon nitride member 1351 overlaps the first silicon nitride film 1311 in this example, the silicon nitride member 1351 may not overlap the first silicon nitride film 1311. Between the silicon nitride member 1351 and the semiconductor region 116, a silicon oxide film 132 is disposed. The silicon oxide film 132 may also cover the opening 130.

The silicon nitride member 1351 can have a hydrogen concentration higher than that of the first silicon nitride film 1311. The first silicon nitride film 1311 may have a hydrogen concentration of zero, but can contain hydrogen. The silicon nitride member 1351 can have a hydrogen permeability higher than that of the first silicon nitride film 1311. The silicon nitride member 1351 and the first silicon nitride film 1311 satisfy at least one of the two relationships with respect to the hydrogen concentration and the hydrogen permeability. A hydrogen concentration of the silicon nitride member 1351 higher than that of the first silicon nitride film 1311 is beneficial in supply of hydrogen from the silicon nitride member 1351 to the semiconductor region 116. A hydrogen permeability of the silicon nitride member 1351 higher than that of the first silicon nitride film 1311 is beneficial in supply of hydrogen from above the silicon nitride member 1351 through the silicon nitride member 1351. Dangling bonds can be reduced by sufficiently supplying hydrogen to the semiconductor region 116 of the well contact part WC, resulting in improvement of sensor characteristics, in particular, resulting in reductions of dark current, white spot, and noise.

The gate electrode 121 is the gate electrode of the first conduction type peripheral transistor (NT). The gate electrode 122 is the gate electrode of the second conduction type peripheral transistor (PT). The peripheral transistor has an LDD structure. That is, the source/drain of a first conduction type peripheral transistor include a first conduction type semiconductor region 123 and another first conduction type semiconductor region 124 having an impurity concentration lower than that of the semiconductor region 123. Similarly, the source/drain of a second conduction type peripheral transistor include a second conduction type semiconductor region 125 and a second conduction type semiconductor region 126 having an impurity concentration lower than that of the semiconductor region 125.

In the pixel circuit section 101, the source/drain part of the pixel transistor has a single drain structure constituted of a semiconductor region having a low impurity concentration. Consequently, the deterioration of the transistor characteristics due to a hot carrier can be suppressed compared to that in the LLD structure of a source/drain part including a semiconductor region having a high impurity concentration and a semiconductor region having a low impurity concentration. This phenomenon is significant in a miniaturized MOSFET. The deterioration of the transistor characteristics by a hot carrier highly depends on the gate length and power source voltage, and a short gate length or a high power source voltage increases the deterioration. The MOSFET of the single drain structure of the pixel circuit section 101 in this example can reduce the deterioration of characteristics by a high power source voltage even if the MOSFET is a miniaturized one having a short gate length.

The peripheral transistor in the peripheral circuit section 102 is an MOSFET including a source/drain part having an LDD structure. Accordingly, both high drive capability and high hot carrier resistance can be achieved. In particular, since the operation in the peripheral circuit section 102 is to be faster compared to that in the pixel circuit section 101, it is important that the peripheral transistor have high drive capability. Therefore, it is important that the MOSFET in the pixel circuit section 101 differ from the MOSFET in the peripheral circuit section 102 in the structure of the electric field relaxation region, as shown in this example. The impurity concentration in the source/drain part of the MOSFET in the pixel circuit section 101 can be set to be lower than that of the semiconductor region having a high impurity concentration in the source/drain part of the MOSFET in the peripheral circuit section 102. The impurity concentration in the source/drain part of the MOSFET in the pixel circuit section 101 can be set to be the same as that of the semiconductor region having a low impurity concentration in the source/drain part of the MOSFET in the peripheral circuit section 102.

A side spacer 1312 including a silicon nitride layer is disposed on the side surfaces of the gate electrodes 121, 122. The side spacer 1312 can further include a silicon oxide layer between the silicon nitride layer and the gate electrode 121 and between the silicon nitride layer and the gate electrode 122.

The surfaces of the source/drain part and the gate electrode of the peripheral transistor are silicided. The source/drain part includes a silicide layer 1341, and the gate electrode includes a silicide layer 1342. The silicide layers 1341, 1342 are made of, for example, cobalt silicide. The silicon oxide film 132 covering the pixel circuit section 101 protects the pixel circuit section 101 from metal contamination by a metal forming a silicide, such as cobalt, during the formation of the silicide layer in the peripheral circuit section 102.

A second silicon nitride film 1352 covers the peripheral transistors NT, PT in the peripheral circuit section 102. Specifically, the second silicon nitride film 1352 covers the silicide layers 1341 and side spacers 1312 of the source/drain parts of the peripheral transistors NT, PT and the silicide layers 1342 on the upper surfaces of the gate electrodes 121, 122. In addition, a silicon oxide film (not shown), like the second silicon nitride film 1352, covering the peripheral transistors NT, PT may be disposed between the second silicon nitride film 1352 and the semiconductor substrate 100 or between the second silicon nitride film 1352 and the gate electrodes 121, 122.

The hydrogen concentration in the second silicon nitride film 1352 can be set to be higher than that in the silicon nitride layer of the side spacer 1312. The hydrogen permeability of the second silicon nitride film 1352 can be set to be higher than that of the silicon nitride layer of the side spacer 1312. The second silicon nitride film 1352 and the silicon nitride layer of the side spacer 1312 satisfy at least one of the two relationships with respect to the hydrogen concentration and the hydrogen permeability. The characteristics of the peripheral transistors can be improved by disposing the second silicon nitride film 1352 having a hydrogen concentration and a hydrogen permeability that are higher than those of components, such as the silicon nitride layer of the side spacer 1312, near the peripheral transistors. The characteristics of the peripheral transistor herein are, for example, noise characteristics, TDDB characteristics, and NBTI characteristics of pMOSFET.

The insulating film 133 covers the whole of the pixel circuit section 101 and the whole of the peripheral circuit section 102. The first silicon nitride film 1311 is disposed between the insulating film 133 and the pixel transistors. The silicon nitride member 1351 is disposed between the insulating film 133 and the semiconductor region 116. The second silicon nitride film 1352 is disposed between the insulating film 133 and the peripheral transistor and between the insulating film 133 and the side spacer 1312. The insulating film 133 has a flat upper surface. An insulating film 143 composed of a plurality of interlayer insulating layers and a wiring structure 142 composed of a plurality of wiring layers and via plugs are disposed on the insulating film 133. The insulating film 133 functions as an interlayer insulating film for the wiring structure 142. A passivation film 144 covers the uppermost wiring layer of the wiring structure 142. The uppermost layer of the wiring structure 142 can include an electrode pad (not shown) for communicating with the outside. Typically, the uppermost wiring layer is an aluminum layer. The passivation film 144 can have an opening (not shown) for exposing the electrode pad to the outside. The semiconductor region (source/drain part) of each element of the pixel circuit 201 and the contact plug 1411 connected to the gate electrode are disposed in the pixel circuit section 101. The pixel circuit section 101 includes a contact plug 1410 connected to the semiconductor region 116 of the well contact part WC of the pixel circuit 201. The contact plug 1411 passes through the insulating film 133, the silicon oxide film 132, and the first silicon nitride film 1311 and is connected to the source/drain part of the pixel transistor. The first silicon nitride film 1311 can function as an etching stopper in the formation of contact holes for the contact plugs 1411 by anisotropic dry etching of the insulating film 133. As a result, the element-isolating insulator 99 is prevented from being etched, even if the contact overlaps the element isolation region due to an alignment error. Consequently, leakage current between the well 117 and the semiconductor regions 114, 115 having a low impurity concentration can be suppressed. Accordingly, the distance between the contact and the element isolation region can be reduced to allow the miniaturization of the elements. The contact plug 1410 connected to the semiconductor region 116 of the well contact part WC passes through the insulating film 133, the silicon nitride member 1351, and the silicon oxide film 132. The contact plug 1410 is positioned in the opening 130 and is surrounded by the first silicon nitride film 1311. The contact plug 1410 is in contact with the insulating film 133, the silicon nitride member 1351, and the silicon oxide film 132 but is apart from the first silicon nitride film 1311. The silicon nitride member 1351 can function as an etching pad in the formation of a contact hole for the contact plug 1410 by anisotropic dry etching of the insulating film 133. As a result, the semiconductor region of the well contact part WC can be prevented from being over-etched in the formation of the contact hole. Consequently, noises such as white spots and dark current due to damage of the semiconductor region of the well contact part WC can be reduced.

The peripheral circuit section 102 includes contact plugs 1412 connected to the semiconductor regions and gate electrodes of the peripheral transistors. The contact plug 1412 passes through the insulating film 133 and the second silicon nitride film 135. The second silicon nitride film 135 functions as an etching pad in the formation of a contact hole for the contact plug 1412. The contact plugs 1410, 1411, 1412 are formed by filling the contact holes formed by etching the insulating film 133 and other films with a conductor such as tungsten. It is possible to reduce the manufacturing cost by forming the first silicon nitride film 1311 in the pixel circuit section 101 and the silicon nitride film as the side spacer 1312 in the peripheral circuit section 102 by a single film.

Figure 3A:
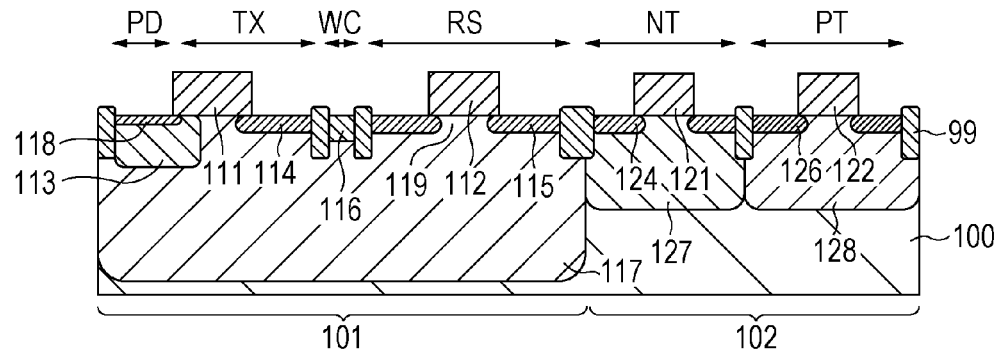
FIGS. 3A to 3L are schematic cross-sectional views illustrating steps of a method of producing an image pick-up apparatus.

A method of producing an image pick-up apparatus 1 will now be described. FIGS. 3A to 3L show a flow of the production process with views of a cross section corresponding to that shown in FIG. 2. Some elements shown in FIG. 2 (i.e., 127 and 128) will be discussed in the description of FIG. 3A shown below A step shown in FIG. 3A will now be described. An insulator 99 of an element isolation part is formed on a semiconductor substrate 100 such as a silicon substrate by, for example, STI or LOCOS. A first conduction type (N type) well 128 and second conduction type (P type) wells 117 and 127 for forming elements are formed in the semiconductor substrate 100. A first conduction type (N type) semiconductor region 113 for a photoelectric conversion element PD is formed in the pixel circuit section 101 for forming pixels. In order to form the photoelectric conversion element PD with an embedded structure, a second conduction type (P type) semiconductor region 118 is formed on the surface of the photoelectric conversion element PD. Subsequently, gate electrodes 111, 112 are formed on the semiconductor substrate 100. Furthermore, a semiconductor region 114 for a detection part FD and a semiconductor region 115 becoming the source and the drain of a pixel transistor having a single drain structure in the pixel circuit section 101 are formed. On this occasion, the gate electrodes 111, 112 can be used as masks. As a result, a first conduction type (N type) semiconductor region 115 having a low impurity concentration of the pixel transistor is formed. In the peripheral circuit section 102, gate electrodes 121, 122 of a MOSFET serving as a peripheral transistor are formed. A first conduction type semiconductor region 124 having a low impurity concentration and a second conductive type semiconductor region 126 having a low impurity concentration are formed by implanting an impurity into a region becoming an LDD structure. The gate electrodes 121, 122 can be also used as masks on this occasion. The dosage for forming the semiconductor region 114, the semiconductor region 115, the semiconductor region 124, or the semiconductor region 126 is approximately $5 \times 10^{12}$ to $5 \times 10^{14}$ (ions/cm$^2$) or approximately $1 \times 10^{12}$ to $1 \times 10^{14}$ (ions/cm$^2$). Implantation of an impurity for forming the first conduction type semiconductor regions 114, 115 and implantation of an impurity for forming the semiconductor regions 124, 126 can be concurrently performed.

Figure 3B:
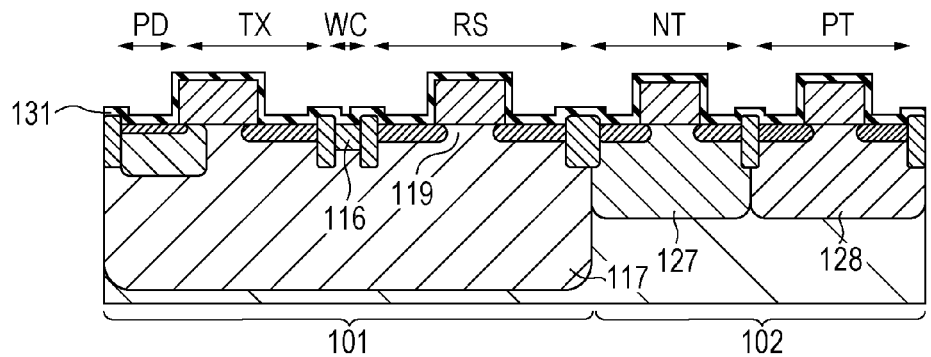

After the step shown in FIG. 3A, as shown in FIG. 3B, a first silicon nitride film 131 covering the pixel circuit section 101 and the peripheral circuit section 102 is formed. The first silicon nitride film 131 covers the photoelectric conversion element PD, an amplifying element SF, and the gate electrode of the peripheral transistor. The first silicon nitride film 131 further covers other pixel transistors, such as a reset element RS and a selection element SL, and the gate electrode 111 of a transfer element TX, and the semiconductor region 114. The first silicon nitride film 131 can be formed by thermal CVD, for example, by LP-CVD using a process gas at a 20 Pa or more and 200 Pa or less. Furthermore, a silicon oxide film can be formed under the first silicon nitride film 131 by, for example, thermal CVD. The first silicon nitride film 131 can have a thickness larger than that of the underlying silicon oxide film. For example, a silicon oxide film having a thickness of 5 to 20 nm is first formed by thermal CVD, and a first silicon nitride film 131 having a thickness of 20 to 100 nm can be formed by thermal CVD. The thermal CVD can form a film with reduced plasma damage compared to formation of a silicon nitride film by plasma CVD, resulting in a reduction of noise. The silicon oxide film also functions as a layer for buffering the stress of the first silicon nitride film 131.

Figure 3C:
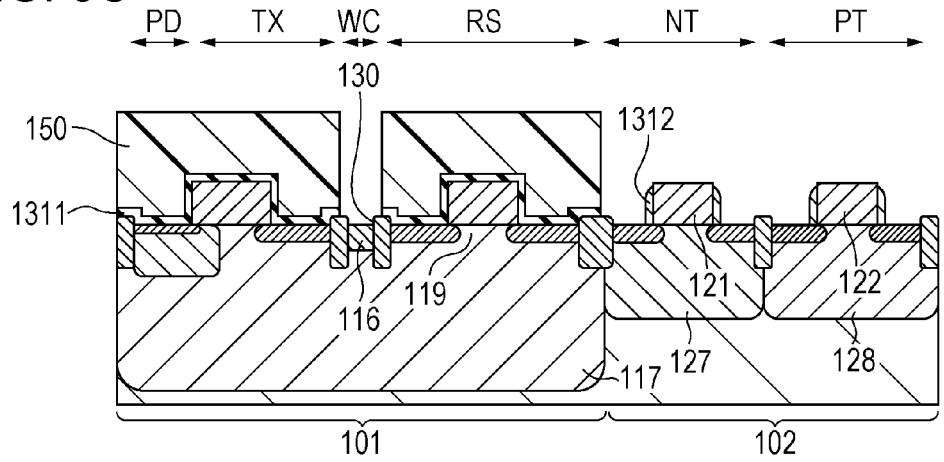

Subsequently, as shown in FIG. 3C, a resist 150 is formed in the pixel circuit section excluding the upper portion than the semiconductor region 116 regulating the well potential of the pixel circuit section 101, and the first silicon nitride film 131 is etched. The first silicon nitride film 131 remains as a first silicon nitride film 1311 in the region covering the photoelectric conversion element PD and the reset element RS, which are protected by the resist 150. The first silicon nitride film 131 also remains as a first silicon nitride film 1311 in the region covering other pixel transistors such as the amplifying element SF and the selection element SL and the region covering the gate electrode 111 of the transfer element and the semiconductor region 114. In contrast, in the peripheral circuit section 102 not protected by the resist 150, a portion of the first silicon nitride film 131 is removed by etching such that another portion of the first silicon nitride film 131 remains on the side surfaces of the gate electrodes 121, 122 to form side spacers 1312 as the remaining of first silicon nitride film 131. The side spacer 1312 has a multilayer structure composed of a silicon oxide layer of the silicon oxide film and a silicon nitride layer of the first silicon nitride film 131. In the etching of this occasion, a part of the first silicon nitride film 131 in the pixel circuit section 101 is etched to from an opening 130. In order to form the opening 130, a portion of the first silicon nitride film 131 is removed by etching. The portion of the first silicon nitride film 131 removed for forming the opening 130 is positioned above a region into which a semiconductor region 116 for well contact is to be formed. The well contact is then formed through the opening 130. The damage of the semiconductor substrate 100 can be suppressed by concurrently performing the etching of the side spacer 1312 and the etching for forming the opening 130. Furthermore, on this occasion, the first silicon nitride film 131 above the elements in the pixel circuit section 101, such as the photoelectric conversion element PD and the amplifying element SF, is not etched. Therefore, these elements can be prevented from being exposed to etching damage, resulting in a reduction of noise. In particular, etching damage of the photoelectric conversion element PD and the amplifying element SF may cause dark current or fixed pattern noise. However, an image pick-up apparatus having excellent noise characteristics can be produced through the process described above.

Figure 3D:
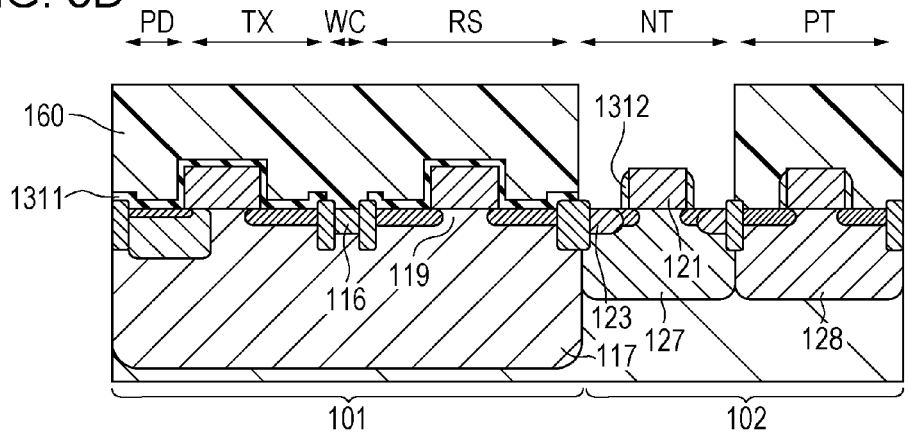

Subsequently, as shown in FIG. 3D, a resist 160 is formed in the pixel circuit section 101 and the peripheral circuit section 102. On this occasion, the resist 160 is not formed in the region corresponding to the first conduction type (N type, NT) MOSFET in the peripheral circuit section 102. A first conduction type (N type) impurity is then implanted using the resist 160, the gate electrode 121 of the first conduction type (N type) MOSFET in the peripheral circuit section 102, and the side spacer 1312 as the mask. As a result, the first conduction type semiconductor region 123 of a source/drain part is formed at a high concentration of a self-aligning impurity at the side of the side spacer 1312.

Figure 3E:
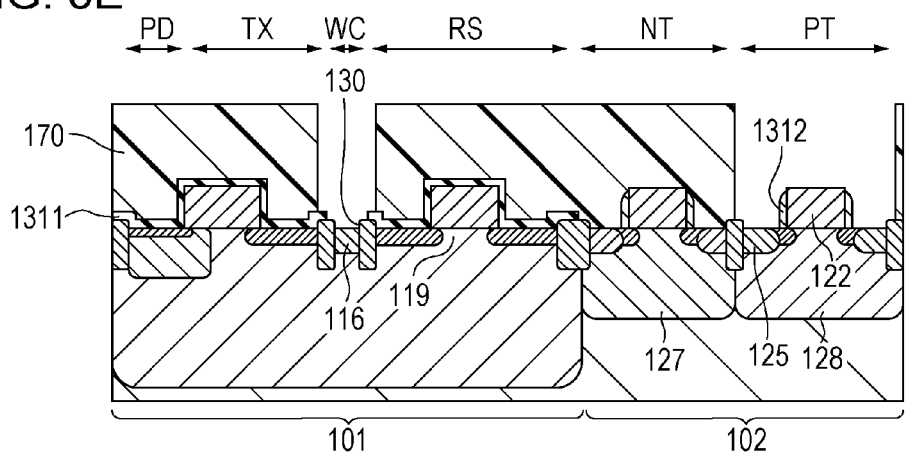

Similarly, as shown in FIG. 3E, a resist 170 is formed so as to have openings at the regions corresponding to the semiconductor region 116 in the pixel circuit section 101 and the second conduction type (P type, PT) MOSFET part in the peripheral circuit section 102. Subsequently, a second conduction type (P type) impurity is then implanted using the resist 170, the gate electrode 122, and the side spacer 1312 as the mask. As a result, a semiconductor region 125 of a source/drain part is formed at a high concentration of a self-aligning impurity at the side of the side spacer. On this occasion, a second conduction type (P type) impurity can also be implanted into the semiconductor region 116 and the well 117 in the pixel circuit section 101 from the opening 130. As a result, the semiconductor region 116 of the well contact part WC can be formed as a second conduction type semiconductor region having a high impurity concentration. The dosage for forming the semiconductor region 123, the semiconductor region 125, or the semiconductor region 116 may be approximately $5 \times 10^{14}$ to $5 \times 10^{16}$ (ions/cm$^2$) or approximately $1 \times 10^{15}$ to $1 \times 10^{16}$ (ions/cm$^2$).

Through the step described above, the MOSFET in the peripheral circuit section 102 has an LDD structure, and the concentration of the second conduction type impurity in the semiconductor region 116 of the well contact can be increased. Consequently, the contact resistance of the semiconductor region 116 can be reduced. The implantation of an impurity for forming the semiconductor region of the well contact and the implantation of an impurity for forming the source and the drain of the second conduction type MOSFET in the peripheral circuit section are simultaneously performed. Annealing may be then performed.

Figure 3F:
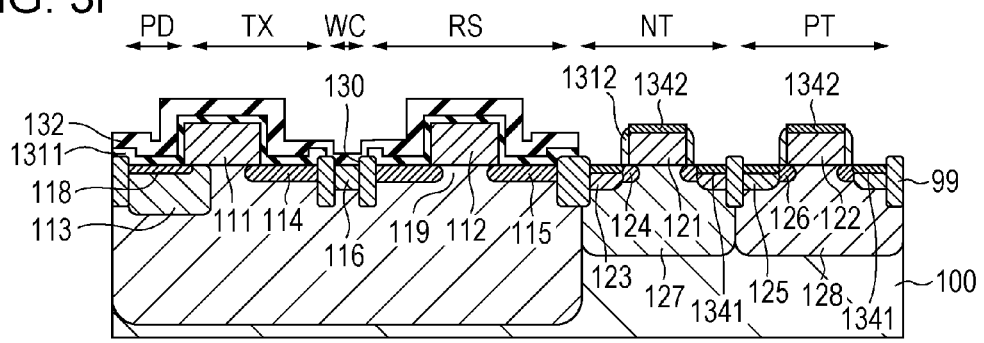

Subsequently, as shown in FIG. 3F, a silicon oxide film 132 for protecting the pixel circuit section 101 in a salicide process is formed in the pixel circuit section 101. The silicon oxide film 132 is formed so as to cover the opening 130. A silicide layer 1341 of, for example, cobalt silicide is then formed on the surface of the source/drain part of the MOSFET in the peripheral circuit section 102 by silicidation of the surfaces of the semiconductor regions 123, 125 having a high impurity concentration due to the salicide process. If a silicide layer is formed in the pixel circuit section 101 by the salicide process, the interface between the silicide layer and the semiconductor substrate 100 may become a noise source. However, since the salicide process is performed in the state that the opening 130 is covered with the silicon oxide film 132, the surface of the semiconductor substrate 100 (the surface of the semiconductor region 116) under the opening 130 can be prevented from silicidation. The salicide process for forming the silicide layer 1341 is concurrently performed with the silicidation with cobalt silicide of the upper surface of the gate electrode of the MOSFET in the peripheral circuit section 102 to form a silicide layer 1342.

Subsequently, a second silicon nitride film 135 functioning as an etching stopper in the formation of the contact hole is formed in the peripheral circuit section 102. The second silicon nitride film 135 is patterned such that the silicon nitride film is disposed in the peripheral circuit section 102 and is not disposed in the pixel circuit section 101. Furthermore, an insulating film 133 of silicate glass, such as BPSG, or silicon oxide formed by, for example, HDP-CVD is formed on the whole surface over the pixel circuit section 101 and the peripheral circuit section 102. The upper surface of the insulating film 133 is planarized by a reflow method, an etching back method, or a CMP method. The contact resistance can be further reduced by performing the thermal diffusion and activation of the impurity implanted in the semiconductor region 116 of the well contact by no later than this stage through annealing at a temperature higher than 800° C. It is difficult to perform the annealing at such a high temperature after the formation of contact holes described below. Accordingly, the annealing at a high temperature should be performed before the formation of contact holes.

Figure 3G:
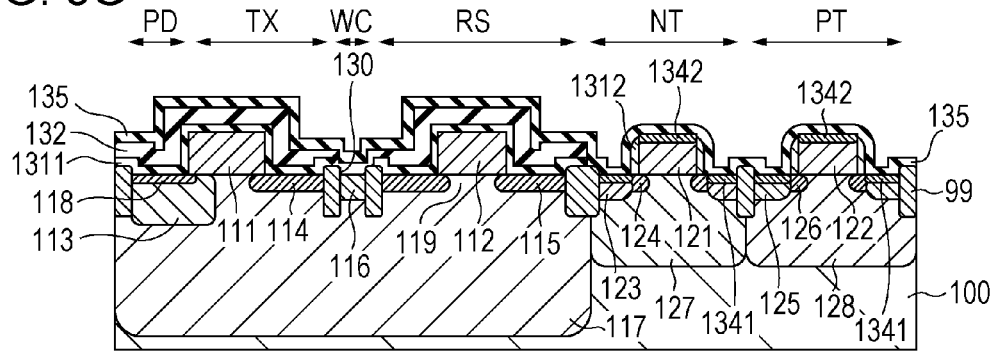

Subsequently, as shown in FIG. 3G, a second silicon nitride film 135 is formed in the pixel circuit section 101 and the peripheral circuit section 102. The second silicon nitride film 135 can be formed by plasma CVD. In peripheral circuit section 102, the second silicon nitride film 135 covers the peripheral transistors. Prior to the formation of the second silicon nitride film 135, a silicon oxide film covering the peripheral transistors may be formed in the peripheral circuit section 102.

Figure 3H:
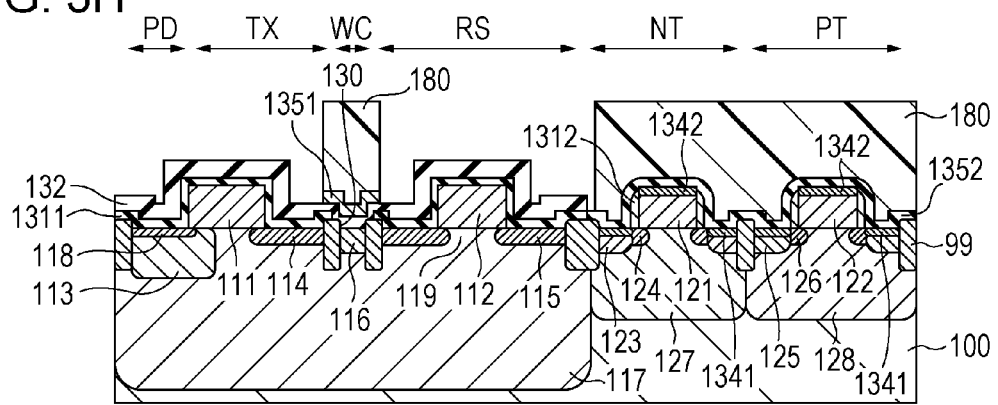

As shown in FIG. 3H, a resist 180 for protecting the second silicon nitride film 135 in the region positioned above the opening 130 is formed in the pixel circuit section 101. In the peripheral circuit section 102, the resist 180 protects the second silicon nitride film 135 in the portion positioned above the peripheral transistor.

One portion of the second silicon nitride film 135 in the pixel circuit section 101 is removed excluding another portion covering the opening 130 by etching using the resist 180 as a mask. As a result, a silicon nitride member 1351 is formed from the second silicon nitride film 135 on the opening 130. In addition, a second silicon nitride film 1352 is formed in the peripheral circuit section 102 from the second silicon nitride film 135. Alternatively, this step may be omitted to leave the second silicon nitride film 135 covering the entire pixel circuit section 101.

Thus, the second silicon nitride film 135 having a high hydrogen concentration is left as the silicon nitride member 1351 or the second silicon nitride film 1352 near the semiconductor region (semiconductor substrate 100). By doing so, hydrogen released from the silicon nitride having a high hydrogen concentration is supplied through the opening 130 to the semiconductor region 116 of the well contact part WC and the peripheral transistor, resulting in a reduction of noise. The release of hydrogen from the silicon nitride having a high hydrogen concentration can occur in the subsequent step involving thermal treatment. In particular, the release of hydrogen significantly occurs in a step involving thermal treatment at 350° C. or more. The step is specifically the thermal treatment for forming an insulator film in the formation of a wiring structure 142 or for forming a metal film for example.

Figure 3I:
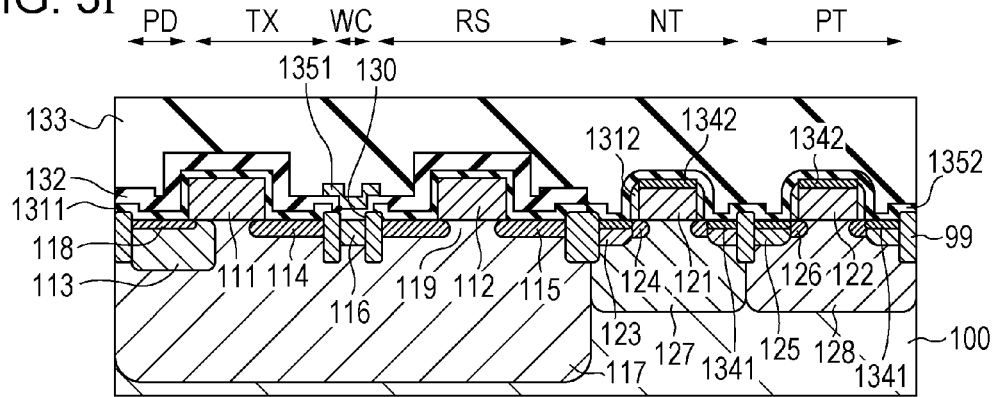

Subsequently, as shown in FIG. 3I, an insulating film 133 covering the pixel circuit section 101 and the peripheral circuit section 102 is formed. The insulating film 133 is planarized by, for example, a CMP method and thereby has a flat upper surface.

Figure 3J:
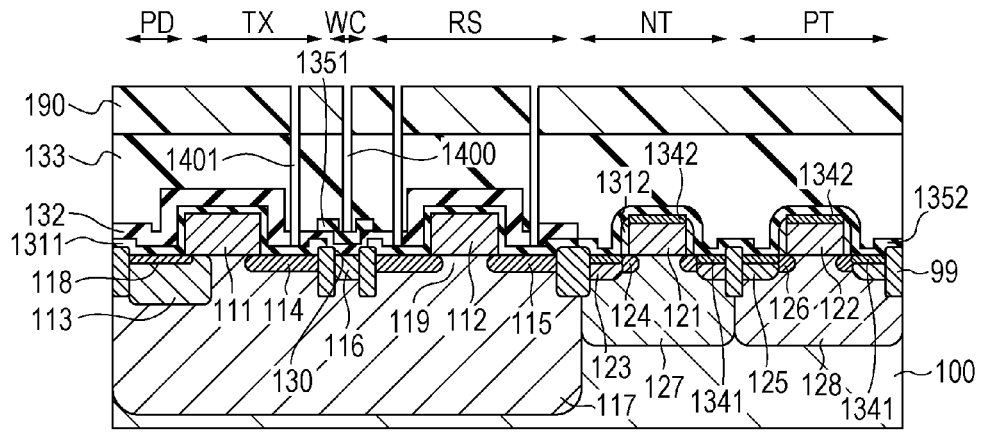
Figure 3K:
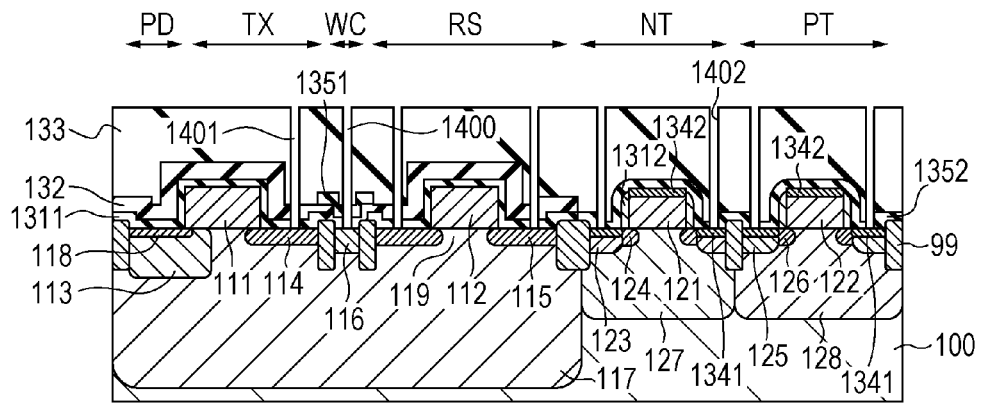

Subsequently, as shown in FIGS. 3J and 3K, the pixel circuit section 101 and the peripheral circuit section 102 are covered with a resist 190 having openings in the pixel circuit section 101.

A contact hole 1400 is formed by anisotropic dry etching using the silicon nitride member 1351 in the pixel circuit section 101 as an etching stopper. In the formation of the contact hole 1400, the insulating film 133 in the upper portion than the silicon nitride member 1351 and the silicon nitride member 1351 are etched. Herein, in order to use the silicon nitride member 1351 as an etching stopper in the formation of the contact hole 1400, the etching rate ER3 in the etching of the insulating film 133 is to be larger than the etching rate ER0 in the etching of the silicon nitride member 1351 (ER3>ER0, and ER3/ER0>5).

A part of a plurality of contact holes 1400 formed in the pixel circuit section 101 is formed at the region positioned above the semiconductor region 116 of the insulating film 133. The contact hole 1400 formed in the opening 130 is surrounded by the first silicon nitride film 1311. The width (diameter) of the contact hole 1400 can be smaller than that of the opening 130.

A contact hole 1401 is formed by anisotropic dry etching using the first silicon nitride film 1311 in the pixel circuit section 101 as an etching stopper. In the formation of the contact hole 1401, the insulating film 133 in the upper portion than the first silicon nitride film 1311 and the first silicon nitride film 1311 are etched. Herein, in order to use the first silicon nitride film 1311 as an etching stopper in the formation of the contact hole 1401, the etching rate ER3' in the etching of the insulating film 133 is to be larger than the etching rate ER1 in the etching of the first silicon nitride film 1311 (ER3'>ER1, or ER3'/ER1>5). The contact hole 1401 and the contact hole 1400 can be simultaneously formed.

Accordingly, the etching rates ER3 and ER3' may be the same, or the etching rates ER1 and ER0 may be the same.

Thus, each semiconductor region of the pixel circuit is exposed to the bottoms of the contact holes 1400, 1401 in the pixel circuit section 101. The portions exposed in the contact holes 1400, 1401 should have an impurity concentration allowing electrical connection by metal wiring. Accordingly, an impurity may be implanted to the semiconductor regions 116, 114, 115 via contact holes. The impurity to be implanted into the semiconductor regions 114, 115 via contact hole 1401 should have the same first conduction type as that of the semiconductor regions 114, 115, whereas the impurity to be implanted into the semiconductor region 116 via the contact hole 1400 may have the first conduction type opposite to that of the semiconductor region 116 or the second conduction type or the both.

Subsequently, as shown in FIG. 3K, the resist 180 is removed, and the pixel circuit section 101 and the peripheral circuit section 102 are covered with a resist having an opening above the peripheral circuit section 102. The resist covers the contact holes 1400, 1401. Subsequently, a contact hole 1402 is formed in the peripheral circuit section 102 by anisotropic dry etching using the second silicon nitride film 1352 in the peripheral circuit section 102 as an etching stopper. In the formation of the contact hole 1402, the insulating film 133 in the upper portion than the second silicon nitride film 1352 and the second silicon nitride film 1352 are etched. Herein, in order to use the silicon nitride film 1352 as an etching stopper in the formation of the contact hole 1402, the etching rate ER3" in the etching of the insulating film 133 is to be larger than the etching rate ER2 in the etching of the second silicon nitride film 1352 (ER3">ER2, and ER3"/ER2>5).

Herein, although the contact hole 1402 in the peripheral circuit section 102 is formed after the formation of the contact hole 1401 in the pixel circuit section 101, the contact hole 1402 may be formed before the formation of the contact hole 1401. The semiconductor region in the pixel circuit section 101 can be prevented from metal contamination due to the metal of the silicide layer 1341, 1342 by thus separately forming the contact holes 1400, 1401 and the contact hole 1402. Alternatively, the contact hole 1402 and the contact hole 1401 may be concurrently formed.

Figure 3L:
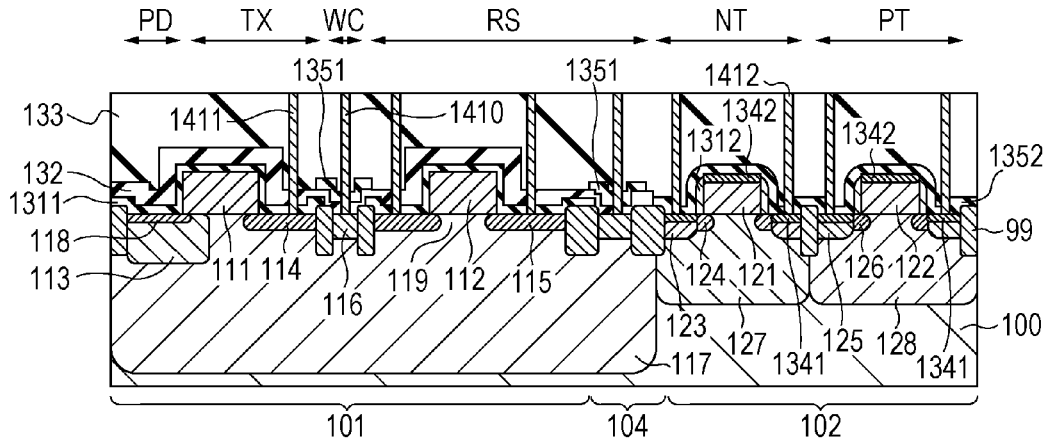

Subsequently, as shown in FIG. 3L, contact plugs 1411, 1412 are formed in the contact holes 1400, 1401, and 1402. Specifically, the contact holes 1400, 1401, 1402 are filled with a conductor such as tungsten, and the excessive conductor outside the contact holes 1400, 1401, 1402 is removed by, for example, CMP.

Subsequently, after aluminum or copper wiring is appropriately performed, a wiring structure 142 as shown in FIG. 2 is formed. A passivation film 144 of silicon nitride covering the wiring structure 142 is formed by, for example, plasma CVD, followed by thermal treatment at about 350° C. or more in a hydrogen atmosphere. The thermal treatment in the hydrogen atmosphere is performed for a longer time than the thermal treatment at 350° C. or more performed in the prior step. In each step of forming a film, the time for maintaining the substrate at 350° C. or more is generally short, such as less than 5 minutes. In contrast, the thermal treatment in a hydrogen atmosphere can be performed for, for example, 15 minutes or more, further, 1 hour or more. Hydrogen supplied via the passivation film 144 permeates through the silicon nitride member 1351 having a high hydrogen permeability and is then supplied to the semiconductor region 116 of the well contact part WC from the opening 130. Similarly, hydrogen permeates through the second silicon nitride film 1352 having a high hydrogen permeability and is supplied to the peripheral transistors.

A color filter array and a microlens array are formed on a planarizing film formed on the passivation film 144. The materials constituting the color filter array and the microlens array are resins having a low thermal resistance temperature. Accordingly, the above-mentioned thermal treatment at about 350° C. or more in a hydrogen atmosphere is performed before the formation of the color filter array and the microlens array. Thus, an image pick-up apparatus 1 can be produced.

In the step of forming a side spacer 1312 by etching the first silicon nitride film 131 in the peripheral circuit section 102, the first silicon nitride film 131 in the pixel circuit section 101 can be concurrently etched. Specifically, an opening 130 is formed by etching the first silicon nitride film 131 at the region positioned above the semiconductor region 116 in the pixel circuit section 101. That is, the step of forming an opening 130 above the semiconductor region 116 is concurrently performed with the formation of the side spacer 1312. Implantation of an impurity into a region that becomes the source/drain part of the second conduction type MOSFET in the peripheral circuit section 102 is concurrently performed with implantation of an impurity into the semiconductor region 116. The implantation of an impurity into the semiconductor region 116 may be concurrently performed with another implantation step. As a result, the manufacturing cost can be decreased by reducing the number of steps, compared to the case of forming a semiconductor region 116 through the formation of an insulating film 133 of, for example, BPSG and then the opening of a contact hole. Furthermore, annealing after the implantation of an impurity into the semiconductor region 116 can sufficiently activate the semiconductor region 116 to be sufficiently connected to the well 117 and further reduces the contact resistance with the contact plug 1411. Since the well contact resistance can be reduced, the reference potential in the pick-up surface can be further stabilized, and a reduction in imaging performance due to shading can be suppressed.

Figure 4A:
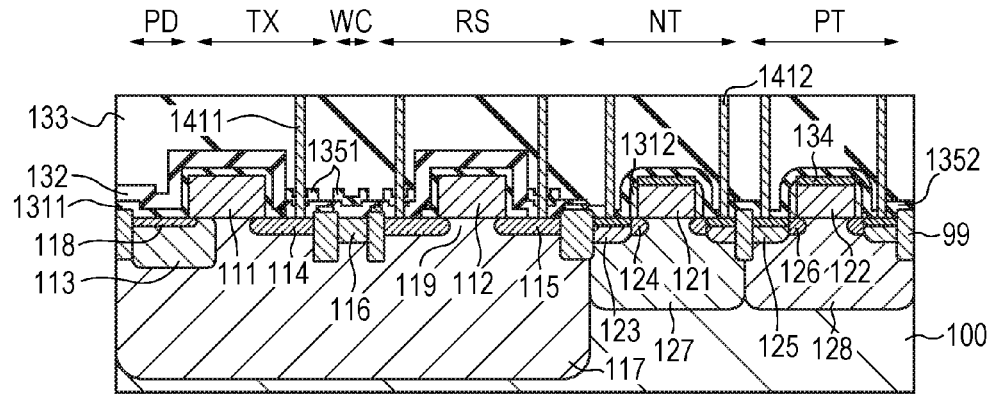
FIGS. 4A to 4C are schematic cross-sectional views of image pick-up apparatuses.

FIG. 4A shows a schematic cross-sectional view of an image pick-up apparatus according to another embodiment. In the pixel circuit section 101, the first silicon nitride film 1311 is provided with openings 130 above the semiconductor region 115 of the source/drain part of the pixel transistor and the semiconductor region 114 of the detection part FD. The openings 130 are covered by a silicon nitride member 1351. The silicon nitride member 1351 is a silicon nitride film formed by plasma CVD having a hydrogen concentration and/or hydrogen permeability higher than that of the first silicon nitride film 1311 formed by thermal CVD. Accordingly, the silicon nitride member 1351 can be readily supplied with hydrogen even if it is connected to the semiconductor regions 114, 115, as in the semiconductor region 116. Although noise is readily caused by the contact plug 1411 in the portion to be connected to a contact plug 1411, such as the semiconductor regions 114, 115, the noise can be reduced by employing the structure described above. FIG. 4A shows a semiconductor region 116 of a dummy well contact part not in contact with the contact plug 1410 in the pixel circuit section 101. Hydrogen is also supplied to the dummy well contact part, and noise is reduced.

Figure 4B:
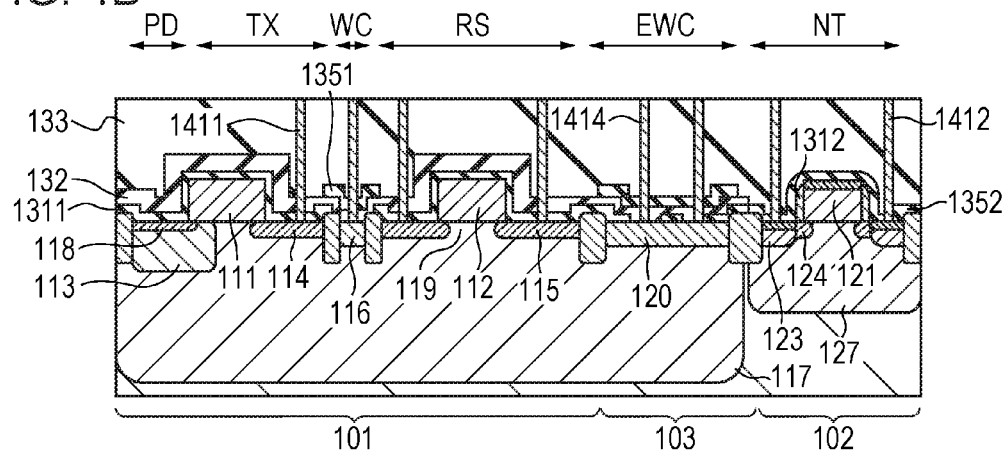
Figure 4C:
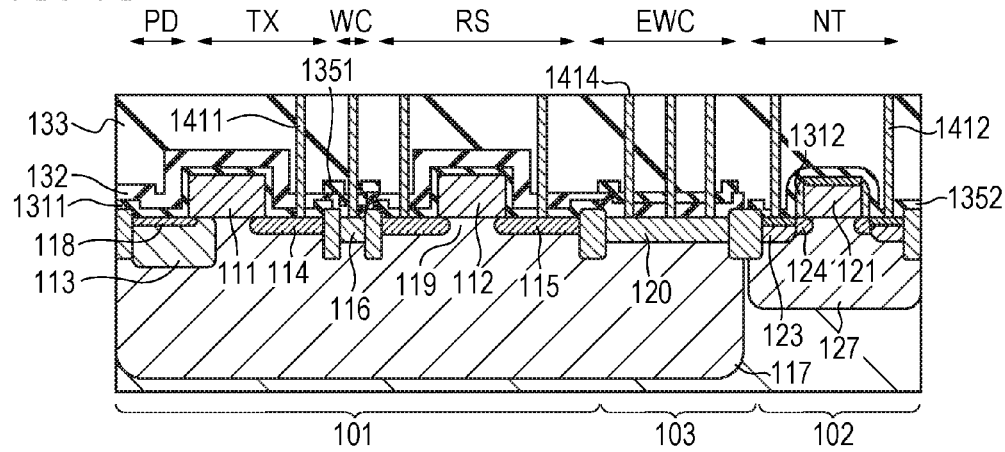

FIGS. 4B and 4C are schematic cross-sectional views of image pick-up apparatuses of other embodiments. As shown in FIG. 1A, an intermediate portion 103 can be disposed between the pixel circuit section 101 and the peripheral circuit section 102. The intermediate portion 103 is a region not including pixel circuits and peripheral circuits. Provision of a large number of well contact parts EWC in the intermediate portion 103 can suppress shading. The well 117 in the pixel circuit section 101 extends to the intermediate portion 103. A contact plug 1414 is connected to the p type semiconductor region 120 provided to the extended p type well 117. In the example shown in FIG. 4B, the contact plug 1414 is surrounded by a first silicon nitride film 1311. In the example shown in FIG. 4C, the contact plug 1414 is not surrounded by a first silicon nitride film 1311.

According to the embodiments described above, image pick-up apparatuses having reduced noise are provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-269672, filed Dec. 26, 2013, which is hereby incorporated by reference herein in its entirety.

What is claimed is:

1. An image pick-up apparatus comprising:
   a pixel circuit section including an array of pixel circuits;
   a peripheral circuit section including a peripheral transistor disposed in the periphery of the pixel circuit section;
   a silicon nitride film covering a photoelectric conversion element in the pixel circuit section;
   a silicon nitride member covering a semiconductor region in the pixel circuit section;
   a silicon oxide film disposed between the silicon nitride member and the semiconductor region;
   an insulating film covering the silicon nitride film and the silicon nitride member and covering the peripheral transistor;
   a first contact plug disposed in a contact hole of the silicon nitride member, the first contact plug being connected to the semiconductor region and being surrounded by the silicon nitride film; and
   a second contact plug passing through the insulating film and being in contact with the peripheral transistor, wherein
   the silicon nitride film has an opening between the silicon nitride member and the semiconductor region,
   the first contact plug is arranged in the opening, and the contact hole of the silicon nitride member has a width smaller than a width of the opening,
   a part of the silicon oxide film is arranged in the opening of the silicon nitride film so that the part of the silicon oxide film is located between the first contact plug and the silicon nitride film,
   the silicon nitride member has at least one of a hydrogen concentration higher than that of the silicon nitride film and a hydrogen permeability higher than that of the silicon nitride film.

2. The image pick-up apparatus according to claim 1, wherein
   the first contact plug passes through the insulating film, and
   the first contact plug is disposed in contact with the silicon nitride member and the silicon oxide film, and not in contact with the silicon nitride film.

3. The image pick-up apparatus according to claim 1, wherein
   the silicon oxide film has a part arranged between the silicon nitride member and the silicon nitride film.

4. The image pick-up apparatus according to claim 1, wherein the semiconductor region constitutes a well contact part through which the first contact plug supplies a potential to a well of the pixel circuit section.

5. The image pick-up apparatus according to claim 1, wherein
the semiconductor region constitutes a source/drain part of the transistor disposed in the pixel circuit section.

6. The image pick-up apparatus according to claim 1, wherein
the semiconductor region constitutes a floating diffusion region of a detecting part disposed in the pixel circuit section.

7. The image pick-up apparatus according to claim 1, wherein
the silicon nitride film covers the photoelectric conversion element, a transfer element for transferring a charge of the photoelectric conversion element, and a floating diffusion region to which the charge is transferred.

8. The image pick-up apparatus according to claim 1, wherein
the silicon nitride film covers a channel part of an amplifying element disposed in the pixel circuit section.

9. The image pick-up apparatus according to claim 1, further comprising:
a side spacer covering side surfaces of a gate electrode of the peripheral transistor and including a silicon nitride layer; and
another silicon nitride film disposed between the insulating film and the side spacer,
wherein the another silicon nitride film covers the peripheral transistor, and the second contact plug being disposed in a contact hole of the another silicon nitride film, and
wherein the another silicon nitride film has at least one of least one of hydrogen concentration higher than that of the silicon nitride layer and a hydrogen permeability higher than that of the silicon nitride layer.

10. The image pick-up apparatus according to claim 1, further comprising an intermediate portion disposed between the pixel circuit section and the peripheral circuit section,
wherein the intermediate portion includes a p type semiconductor region and contact plugs passing through the insulating film and connected to the p type semiconductor region, and the intermediate portion does not include a pixel circuit and a peripheral circuit, and
wherein the contact plugs are apart from the silicon nitride film.

11. The image pick-up apparatus according to claim 1, wherein an element-isolating insulator is located in the pixel circuit section, and the element-isolating insulator is located on sides of the first contact plug.

\* \* \* \* \*